United States Patent [19]
Paton et al.

[11] Patent Number: 5,869,801
[45] Date of Patent: Feb. 9, 1999

[54] DEVICE FOR MANUAL ELECTRON BEAM PROCESSING OF MATERIALS IN SPACE

[75] Inventors: Boris E. Paton; Vsevolod F. Lapchinskii; Victor V. Stesin; Valeri A. Kryukov; Victor F. Shulim; Sergei S. Gavrish; Alexandr R. Bulatsev; Vladimir V. Demyanenko; Alexandr A. Zagrebelnii, all of Kiev, Ukraine; Vladimir P. Nikitskii, Kaliningrad, Russian Federation; Yuri P. Semenov; Svetlana E. Savitskaya, both of Moscow, Russian Federation; Vladimir A. Dzhanibekov, Shelkovov, Russian Federation; Alexandr V. Markov, Chelyuskinskii Town, Russian Federation; Boris I. Perepechenko, Kiev, Ukraine

[73] Assignee: The E.O. Paton Electric Welding Institute of the National Academy of Sciences of Ukraine,, Ukraine

[21] Appl. No.: 599,971

[22] Filed: Feb. 14, 1996

[30] Foreign Application Priority Data

Feb. 15, 1995 [UA] Ukraine ............................. 950020682

[51] Int. Cl.$^6$ ................................................. B23K 15/00
[52] U.S. Cl. ............................. 219/121.12; 219/121.13; 219/121.15
[58] Field of Search ..................... 219/121.12, 121.13, 219/121.15, 121.24, 121.34; 244/158 R, 159

[56] References Cited

U.S. PATENT DOCUMENTS 3,392,261 7/1968 Schollhammer .
3,483,352 12/1969 Schollhammer .
3,761,676 9/1973 McFarland et al. ................ 219/121.13
5,321,336 6/1994 Cirri ..................................... 244/158 R

OTHER PUBLICATIONS

Paton et al., "Electron Beam Welder for Space," Joint Publications Research Service Report No. JPRS–53110, Washington D.C., May 1971.
Paton et al., "Testing the Versatile Hand Electron Beam Tool in Space," Proc. of Welding under Extreme Conditions, Helsinki, Finland, pp. 189–196., Sep. 1989.
Hooper, "Onorbit Electron Beam Welding Experiment Definition, " NASA Report, Contract No. NAS8–37756., Sep. 1989.
Irving, "Electron Beam Welding, Soviet Style: A Front Runner for Space," Welding Journal, pp. 55–59., Jul. 1991.
Dzhanibekov et al., "Welding Equipment for Space Applications," Proceedings of Welding in Space and the Construction of Space Vehicles by Welding, New Carolton, MD, pp. 49–58., Sep. 1991.
"Electron Beam Welder For Space", F.R. Schollhammer, Hamilton Standard Divison of United Aircraft Corporation 6th National Symposium on Materials for Space Vehicle Use, Nov. 18, 19, 20, 1963.

*Primary Examiner*—Gregory L. Mills
*Attorney, Agent, or Firm*—Daniel N. Lundeen; Mark R. Wisner

[57] ABSTRACT

A device for electron beam processing of materials in space designed for the performance of the technical operations of welding, cutting, heating, filler welding, tube welding, brazing, coating deposition by the method of thermal evaporation of materials under vacuum by an operator in a spacesuit during EVA. The device includes a range of replaceable electron beam handtools, control and power supply modules, connection cables and a module for monitoring the condition of the device which is placed inside the space vehicle.

9 Claims, 8 Drawing Sheets

DEVICE FOR MANUAL ELECTRON BEAM PROCESSING OF MATERIALS IN SPACE

FIELD OF THE INVENTION

The invention pertains to tools designed for space applications, and more specifically, to electron beam (EB) welding equipment for manual performance of mounting or repair work during extravehicular activity (EVA) by an operator in a spacesuit. The equipment can also be used in special ground laboratories by an operator in a spacesuit.

BACKGROUND OF THE INVENTION

An electron beam welding device is known which consists of an electron beam gun, high-voltage cable, high-voltage power source, low-voltage power source and low-voltage power cable or storage battery (Electron Beam Welder for Space, F. R. Shollhammer, Hamilton Standard Division of United Aircraft Corporation, 6th National Symposium on Materials for Space Vehicle Use, Nov. 18, 19, 20, 1963). Such a device cannot be used for performance of repair-mounting work in space because of the difficulty of manipulating the massive (120 lb=54 kg) EB gun by the operator in a spacesuit, i.e. because there is no mobile tool for manual work performance and also because of the higher risk involved when using the high-voltage cable and higher anode power voltage (80 kV) of the EB gun.

A device for electron beam welding at earth surface conditions is known which consists of an EB gun powered by low-voltage and high-voltage power sources connected in series. The EB gun and the high-voltage power source are placed in a vacuum chamber, whereas the low-voltage source is located outside the chamber, and these power sources are connected by a low-voltage cable (Chvertko A. l., Nazarenko O. K., Svyatskii A. M., Nekrasov A. l., Equipment for EB Welding, Kiev, "Naukova Dumka," 1973, p. 185). Such a device cannot be used to perform the repair-mounting work in space, in view of its limited mobility, since part of the equipment is located in a compartment which cannot be depressurized, and also because it lacks a tool for performing manual work.

A device for EB welding is known which comprises an electron beam gun and high-voltage power source which are rigidly fastened to each other (Chvertko A. l., Nazarenko O. K., Svyatskii A. M., Nekrasov A. l., Equipment for EB Welding, Kiev, "Naukova Dumka," 1973, p. 360, FIG. 286). However, such a device was used only as a stationary component of equipment which operated in an automatic mode.

Self-sufficient devices for investigation of EB welding under the conditions of space are also known to incorporate EB guns, high-voltage and low-voltage power sources designed as one module, and also a storage battery. These devices were permanently mounted inside the pumped-down compartments of the Soyuz-6 and Skylab space vehicles and functioned in the automatic mode with remote control from a panel which was located in the living quarters (Chvertko A. l., Nazarenko O. K., Svyatskii A. M., Nekrasov A. l., Equipment for EB Welding, Kiev, "Naukova Dumka," 1973, pp. 360–361; Lienay H. G., Lowry I. F., Hassan S. V., Battery Powered Electron Beam Device, "Welding & Metal Fabrication," 1967, 35, No. 12, pp. 472–478). These devices cannot be used for performing repair work because they are cumbersome and cannot be manipulated by the astronaut-operator.

A device for manual EB welding in space is known (Chvertko A. I., Nazarenko O. K., Svyatskii A. M., Nekrasov A. l., Equipment for Electron Beam Welding, Kiev, "Naukova Dumka," 1973, p. 357, FIG. 280). This device accommodates the low-voltage (inverter) and high-voltage (stepping-up transformer, rectifier) power sources designed as one module and a mobile EB gun with a high-voltage power cable. These devices, however, do not include engineering to make them suitable for safe and convenient operation during EVA.

Also known are the gun-type tools for electron beam welding under vacuum, comprising an EB gun with a handle and high-voltage cable, which are moved and controlled by an operator in a spacesuit (Chvertko A. l., Nazarenko O. K., Svyatskii A. M., Nekrasov A. l., Equipment for EB Welding, Kiev, "Naukova Dumka," 1973, p. 358; Zagrebelnii A. A., et al., A Unit for Manual EB Welding, E.O. Paton Electric Welding Institute of the Ac. of Scs. of Ukr.SSR, Newsletter 31 (998), 1976). However, the mobile flexible high-voltage cable which is part of these tools is a less reliable element and a source of potential danger to the operator. Also, in these tools the weight of the gun is shifted forward and accounts for the largest share of the total tool weight, i.e. the moment of inertia of the handtool relative to the handle is high, which makes it difficult for the operator, especially under zero gravity, to perform the precise small displacements which are necessary in welding.

Stationary mechanisms for filler feed are known to be used in electron beam welding (Chvertko A. l., Nazarenko O. K., Svyatskii A. M., Nekrasov A. l., Equipment for EB Welding, Kiev, "Naukova Dumka," 973, pp. 62–63, FIG. 32). Such filler feed mechanisms cannot be used in handtools for EB welding in space because of the relatively large dimensions and rigid fastening of these mechanisms relative to the butt being welded.

Additional focusing systems of EB guns are known to be used for forming the electron beam (Chvertko A. l., Nazarenko O. K., Svyatskii A. M., Nekrasov A. l., Equipment for EB Welding, Kiev, "Naukova Dumka," 1973, p.121–129, FIGS. 52, 76, 78, 79, 80). Such focusing systems cannot be used in handtools for electron beam welding in space because of their relatively large overall dimensions, high power consumption and cooling system requirements.

A device for melting materials in space is known which contains a crucible with the molten material and heat source (U.S. Pat. No. 3,647,924). This device addresses the issues of structural strength and rigidity, but does not provide any means for containing the melt under zero gravity which makes it impossible for an operator in a spacesuit to use this device.

SUMMARY OF THE INVENTION

The present invention eliminates or significantly alleviates the above disadvantages of the prior art and allows an operator in a spacesuit to manually perform mounting or repair work during EVA, in particular, welding, cutting, heating, filler welding, tube welding, brazing, coating deposition by thermal evaporation of materials under vacuum, and the like, using simpler and more reliable means with application of low accelerating voltages.

We have developed a device for manual electron beam manual processing of materials in space. This device includes one or more interchangeable handtools for performing welding, cutting, heating, filler welding, tube welding, coating deposition by thermal evaporation of materials under vacuum, or the like. The device includes a sealed, gasfilled housing for low-voltage hardware comprising an invertor, control system, and electric heater. Installed on an outer surface of the housing are devices for fastening the housing to a surface of a space vehicle, a panel for controlling operation of the device, and a seat for placing and fastening of replaceable handtools, e.g. during transportation and during pauses in operation. The seat is preferably fitted with a high-melting metallic shield mounted in front of an electron beam (EB) gun in the replaceable handtool in the storage position to protect the space vehicle from the electron beam action during test actuation. Cables connect the monitoring module, handtools and a primary power source to the low-voltage hardware in the housing using electrical connectors which are specially designed to be used by an operator in a spacesuit. A monitoring module is located inside the space vehicle for monitoring conditions of the device and of the atmosphere in the housing before starting work, preferably before the operator leaves the space vehicle.

Each handtool preferably includes a high-voltage power source enclosed in a casing which supports the EB gun connected to the high-voltage power source. The EB gun is preferably a short-focus EB gun secured to a front part of the protective casing. A mesh shield covers the EB gun to prevent contact with the operator spacesuit. The casing is fitted with a handle with a trigger. The handle is preferably connected to a lower part of the protective casing and is capable of rotation around its axis and of fixation in extreme and intermediate positions selected in such a way that the EB gun could not be pointed at the operator. The trigger is preferably a non-fixing at least two-position trigger electrically connected through an AND logic circuit to a button for switching off power located on the control panel. A protective guard protects the operator's hand from any light and X-ray radiation generated during operation of the device. A switch is provided with a neutral lead for selection and indication of emmittance of the EB gun. The connecting cable to the handtool is a flexible low-voltage cable with an electrical connector which connects the handtool to the housing for the low-voltage hardware and allows the handtools to be interchangeably connected by an operator in a spacesuit during EVA. A visual indication system gives a signal about switching on the control panel or about switching on, in addition to the already switched on electron beam, of other handtool components, e.g. the devices supporting the performance of various technical processes.

For performing filler welding, one of the replaceable handtools incorporates a filler feed mechanism, having the capability of setting-up rotation around the electron beam axis, so that the direction of the filler feed changes upon changing of the welding direction, and the earlier mentioned system of visual indication gives an indication to the operator about the functioning of the filler feed mechanism. Also, the filler feed mechanism is fitted with a replaceable cassette containing the filler, e.g. to match the material of the workpieces to be welded.

For welding, cutting, brazing and heating of materials, one of the replaceable handtools incorporates a device for additional focusing of the electron beam as required for performing these processes on various materials and thicknesses.

For tube welding, one of the replaceable handtools contains a wheel or rotating part for orbital rotation of two electron beam guns diametrically positioned on the rotating wheel. The wheel has a radial slot to simplify mounting of the replaceable handtool about the tube and removal of the handtool from the tube. The rotating part interacts with support rollers and a rotation drive, and is fitted with a gear ring and the two diametrically opposed guns. A stationary part comprises a mechanism for positioning and fixation on the tube to be welded. Radial openings are provided for mounting and removing the handtool on and from the tubing which are made in the gear ring and in the mechanism for positioning and fixation on the tube wherein a width of the radial openings exceeds a diameter of the tubing. Limit switches are located on the rotating part which allow the EB guns to be turned through an angle of not less than 180 degrees to each side of an initial position, at which angle the openings in the gear ring and in the mechanism of positioning and fixation on the tube coincide, the openings being cut out in such a way that in each direction of rotation only one electron beam gun can be switched on.

For coating deposition by thermal evaporation of materials under vacuum, one of the replaceable handtools incorporates at least one crucible with a vaporizable material located in front of the EB gun. A bottom of the crucible is made to have a concave shape and fitted with a heat-sink comprising a thin-walled sleeve with a flange which is connected to the replaceable handtool by insulating gaskets. A closed, high-melting partition of a wettable material with capillary properties, having holes for letting out vapor, made of a mesh, is located inside the crucible along its axis and fastened at opposite ends to the bottom and cover of the crucible, with a channel for directing and forming the vapor flow. The diameter and length of the channel are given by the following ratios: $0.6\ L < d < L$ and $0.5\ h < L < 0.7\ h$; where L is the channel length, d is the channel diameter, and h is the distance from an outer edge of the channel to a protrusion on the crucible bottom.

In an alternative embodiment for coating deposition by thermal evaporation of materials under vacuum, one of the replaceable handtools incorporates a high-melting plate which is heated from one side by the electron beam, and the other side of which receives sprayable material from a replaceable cassette of a feed mechanism. This process is preferably accompanied by a visual indication of switching on of the feed mechanism.

DETAILED DESCRIPTION OF THE INVENTION

Figure 1:
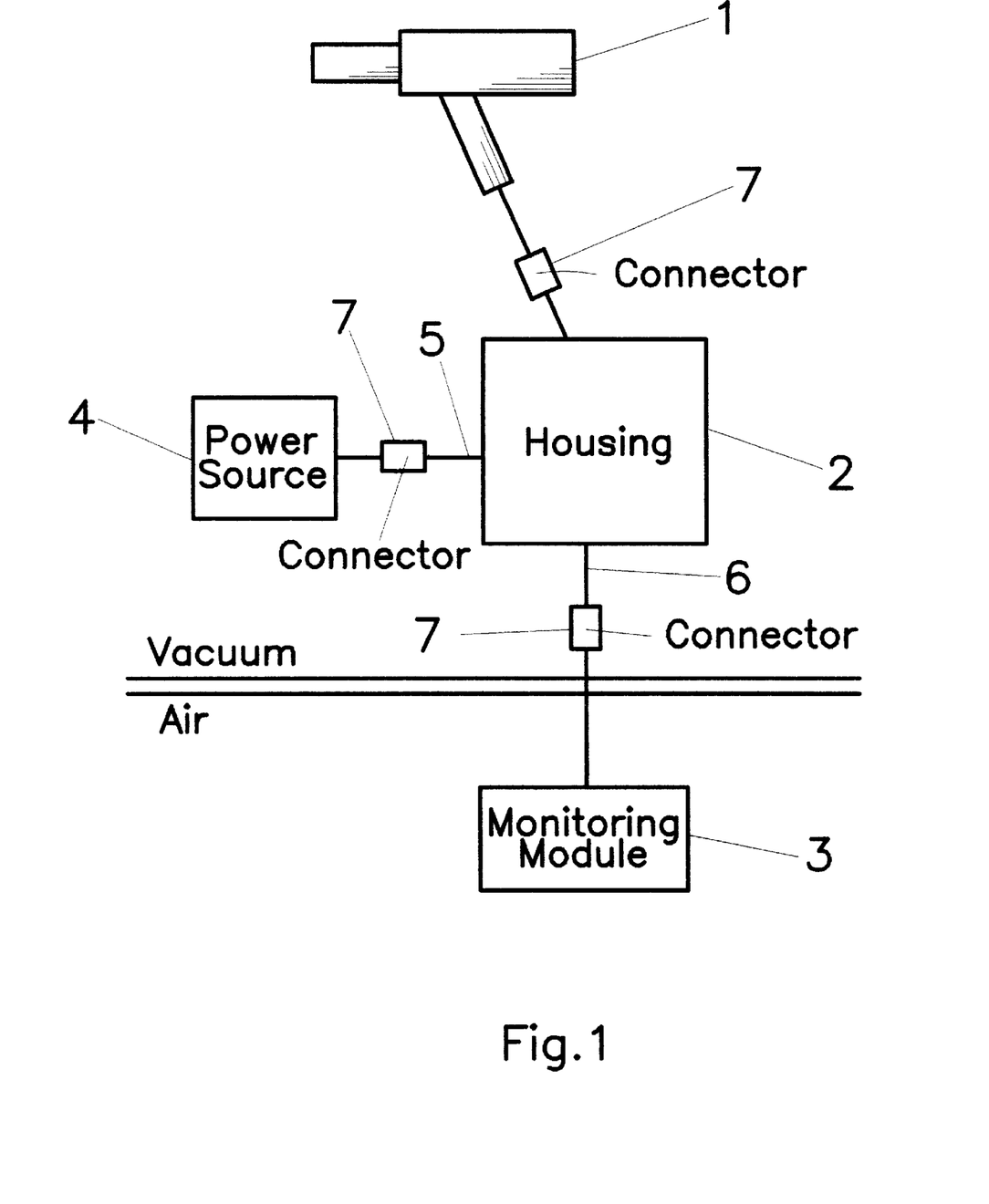
FIG. 1 represents a block diagram of a device according to the present invention for manual electron beam processing of materials in space.

The present device for manual electron beam processing of materials in space FIG. 1 uses a replaceable handtool 1 for performing various technical operations, a container 2 housing the low-voltage hardware (not shown), both of which are placed outside the space vehicle, and a monitoring module 3 which is located inside the space vehicle. These are connected to each other and to a primary power source 4 by cables 5, 6 into one circuit by means of electrical connectors 7 which are specially designed to be manipulated by an operator in a spacesuit.

Figure 2:
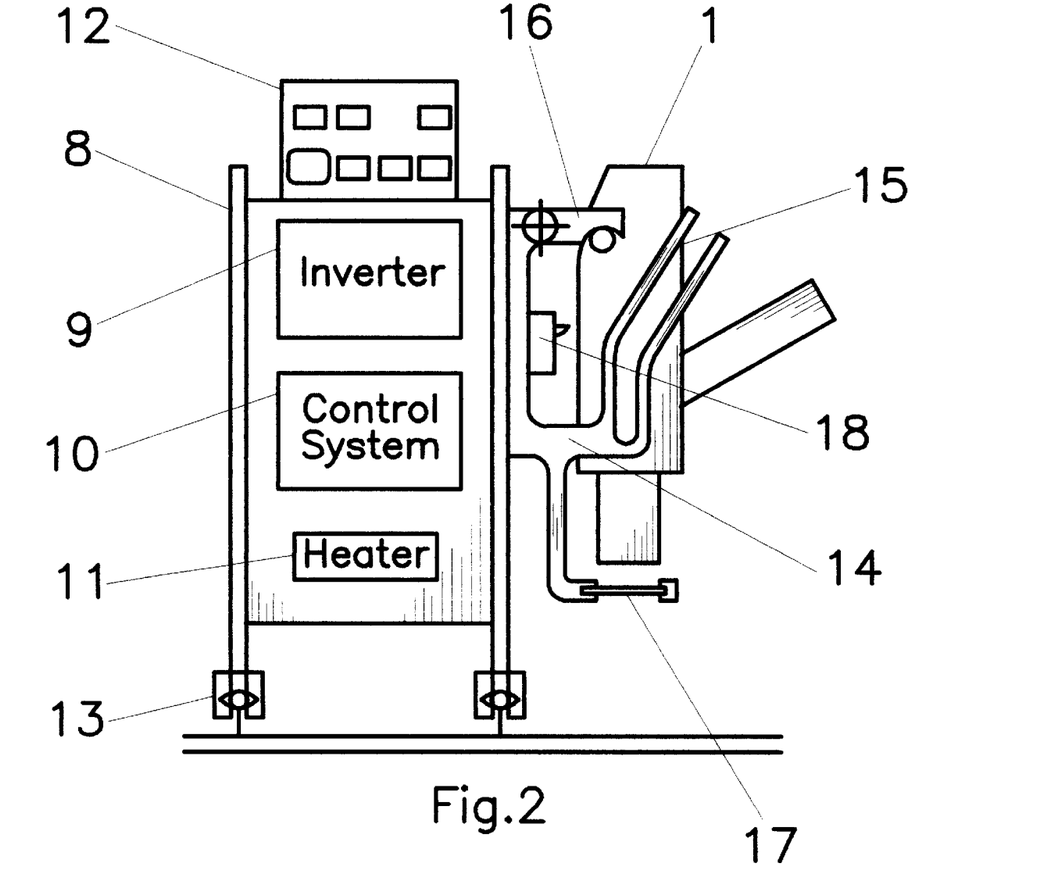
FIG. 2 is a schematic representation of the housing for the low-voltage hardware which is placed outside the space vehicle, and its components which are either enclosed in the housing, or located on an outside surface of the housing.

The container 2 housing the low-voltage hardware incorporates, as best seen in FIG. 2, an inverter 9, control system 10, and electric heater 11, in a sealed, gas-filled casing 8. A control panel 12 for controlling operation of the device, fastening devices 13 for attachment to a surface of the space vehicle, seat 14 for placement and fixation, by means of the slots 15 and latches 16, of the replaceable handtool 1 during transportation and pauses in operation, fitted with a high-melting shield 17 mounted in front of the replaceable handtool 1 in the seat 14, and indicator 18 of the replaceable handtool 1 being in the seat 14, are installed on an outer surface of the container 2.

Figure 3:
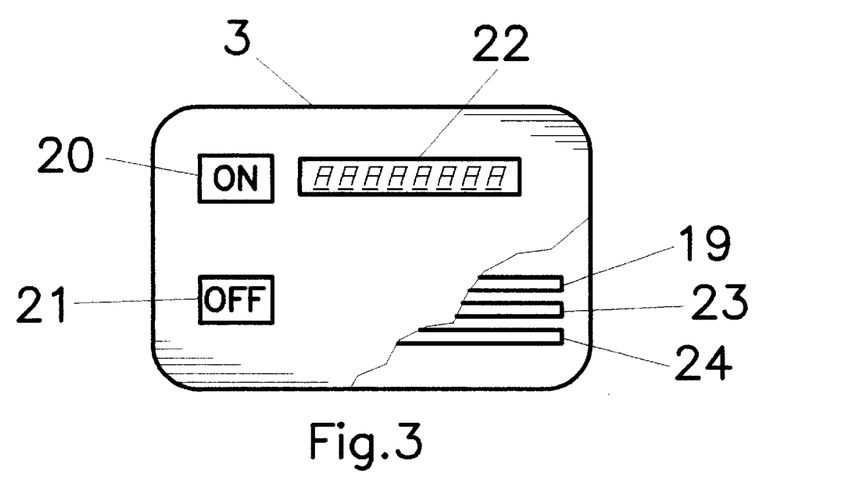
FIG. 3 shows the front panel of the monitoring module which is located inside the space vehicle, and the instruments and elements which it accommodates.

The monitoring module 3 is located inside the space vehicle. As seen in FIG. 3, the monitoring module 3 includes instruments 19 to monitor parameters which indicate the condition of the entire device for manual electron beam processing of materials in space and of the atmosphere in the container 2, additional controls for switching on 20 and switching off 21 the replaceable handtool 1, and panel 22 on which the above-mentioned parameters are indicated.

Logic elements 23 connect the switching on controls 20 of the replaceable handtool 1 to the indicator 18 on the container 2 and to the panel 12, and allow the switching on of the replaceable handtool 1 to be performed only through the monitoring module 3 when the handtool 1 is in the seat 14, and through the panel 12, when the replaceable handtool 1 is not in the seat 14.

An OR logic element 24 connects the controls for switching off 21 the replaceable handtool 1 which are on the monitoring module 3, inside the space vehicle, to those which are on the panel 12 which is on the container 2, outside the space vehicle.

Figure 4:
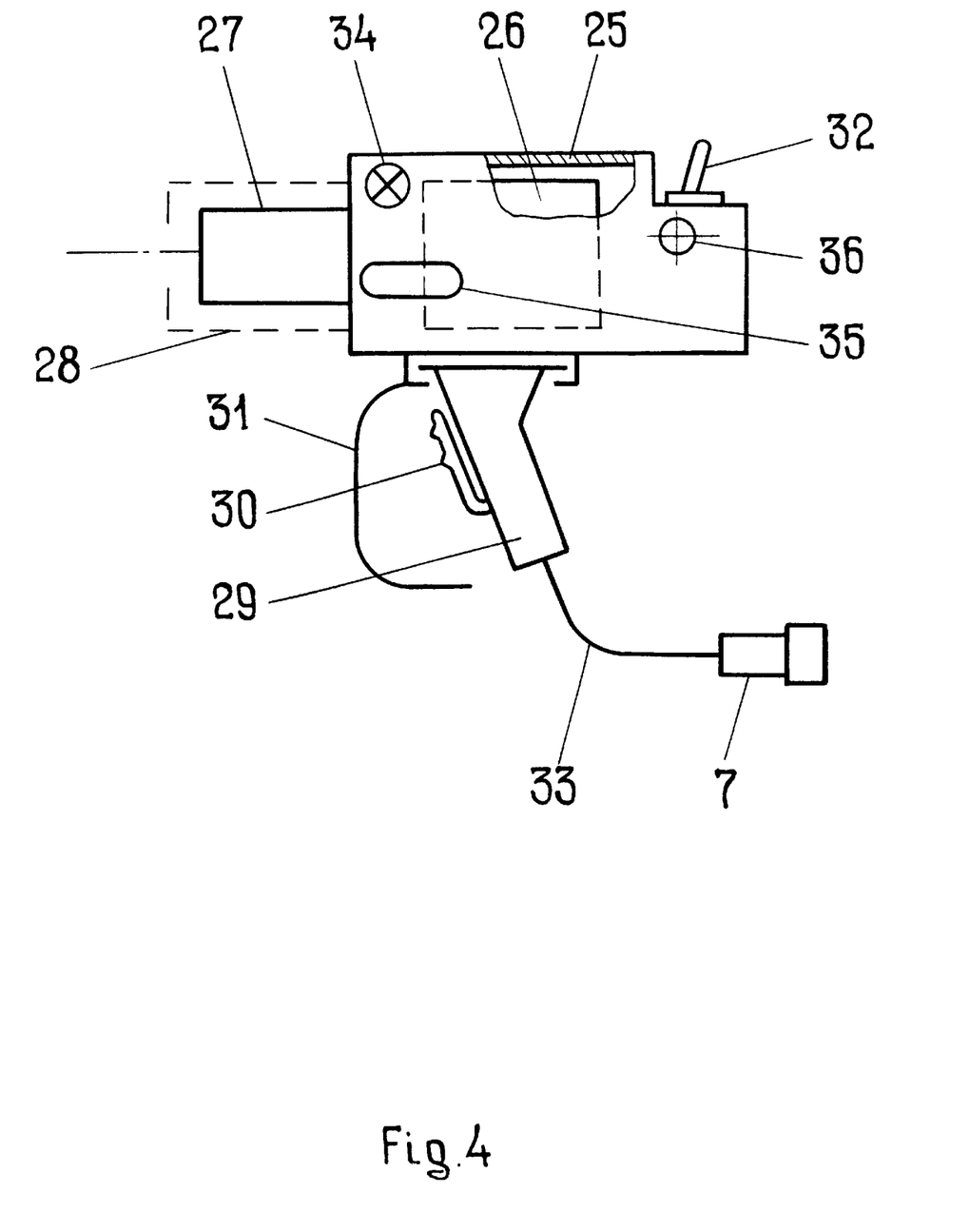
FIG. 4 is a schematic representation of the replaceable handtool and the relative position of its components.

As seen in FIG. 4, each replaceable handtool has a protective casing 25 which accommodates a high-voltage power source 26. An electron beam gun 27 is covered by a mesh shield 28, preventing contact with the operator's spacesuit, and secured to the casing 25. A handle 29 is equipped with a multi-position trigger 30. A protective guard 31 protects the operator's hand from exposure to any light and x-ray radiation which might be generated during operation of the device. A neutral lead switch 32 is provided for selection and indication of the emitter of the electron beam gun 27. A flexible, low-voltage cable 33 with the electrical connector 7 connects the replaceable handtool 1 to the container 2, and enables an operator in a spacesuit to change the replaceable handtools 1 outside the space vehicle during the performance of work.

A visual indicator 34 indicates the operator switching on, by pressing the trigger 30, the next power level, as compared to the power level which has been selected on the control panel 12, or the operator switching on, in addition to the already switched on electron beam, the devices for the performance of various technical processes. Keys 35 and rollers 36 fit the respective slots 15 and latches 16 of the seat 14 for placement and fixation of the replaceable handtool 1.

Figure 5:
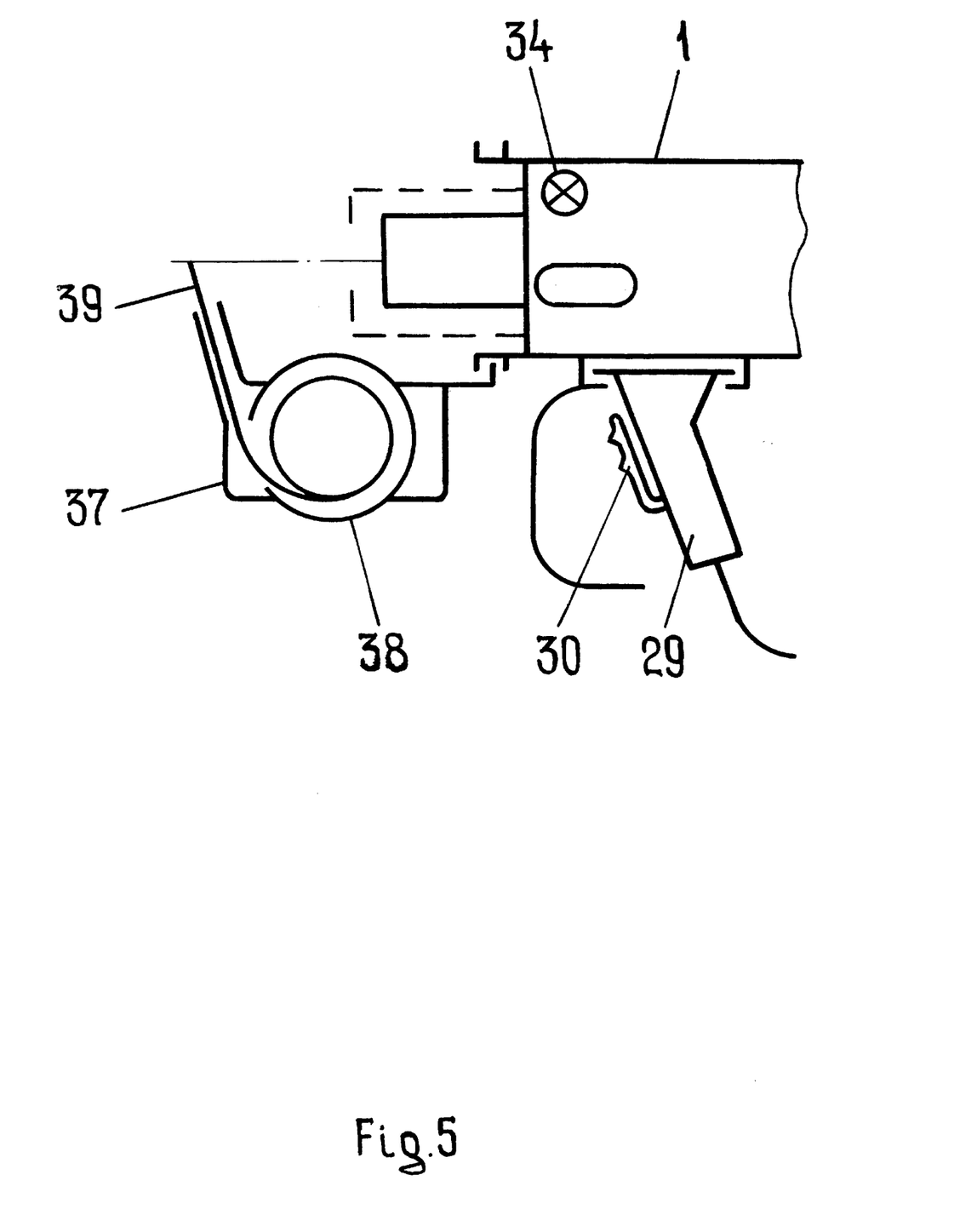
FIG. 5 shows the handtool equipped with the device for filler welding.

The replaceable handtool 1 of FIG. 5 is designed for welding with feeding of a filler. A filler feed mechanism 37 has the capability of setting-up rotation around the axis of the electron beam when changing the direction of welding displacement. The earlier mentioned visual indicator 34 provides indication of the operation of the filler feed mechanism 37 for the operator. Also, the filler feed mechanism 37 is fitted with a replaceable cassette 38 which carries the filler 39 which matches the material of the workpieces to be welded.

Figure 6:
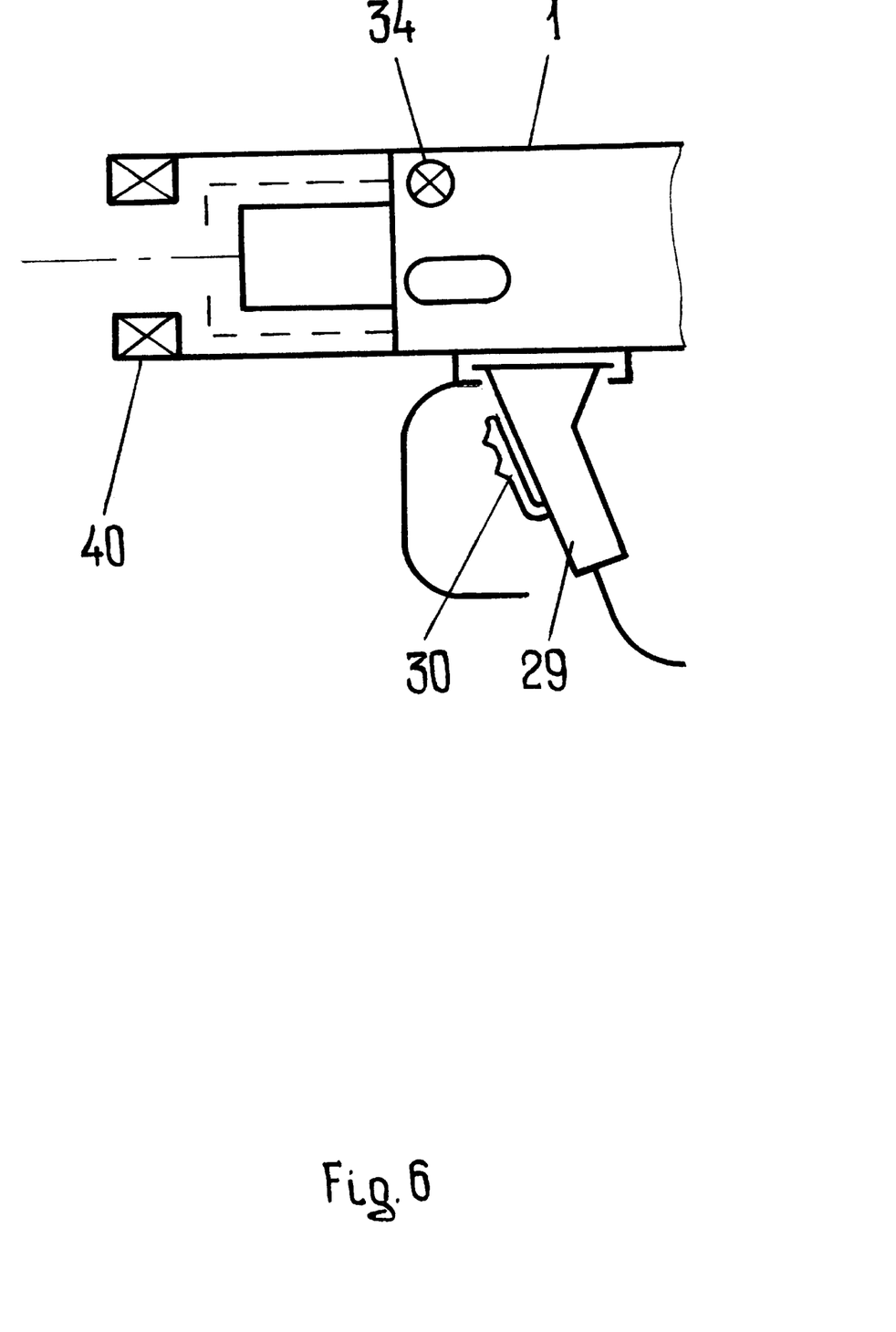
FIG. 6 shows the handtool equipped with the device for welding, cutting, brazing and heating of materials, which incorporates a mechanism for additional focusing of the electron beam.

The replaceable handtool 1 of FIG. 6 is adapted to perform welding, cutting, brazing and heating of materials. An electron beam focusing device 40 is required for performing these technical processes, depending on the kind of material being processed and the workpiece thickness.

Figure 7:
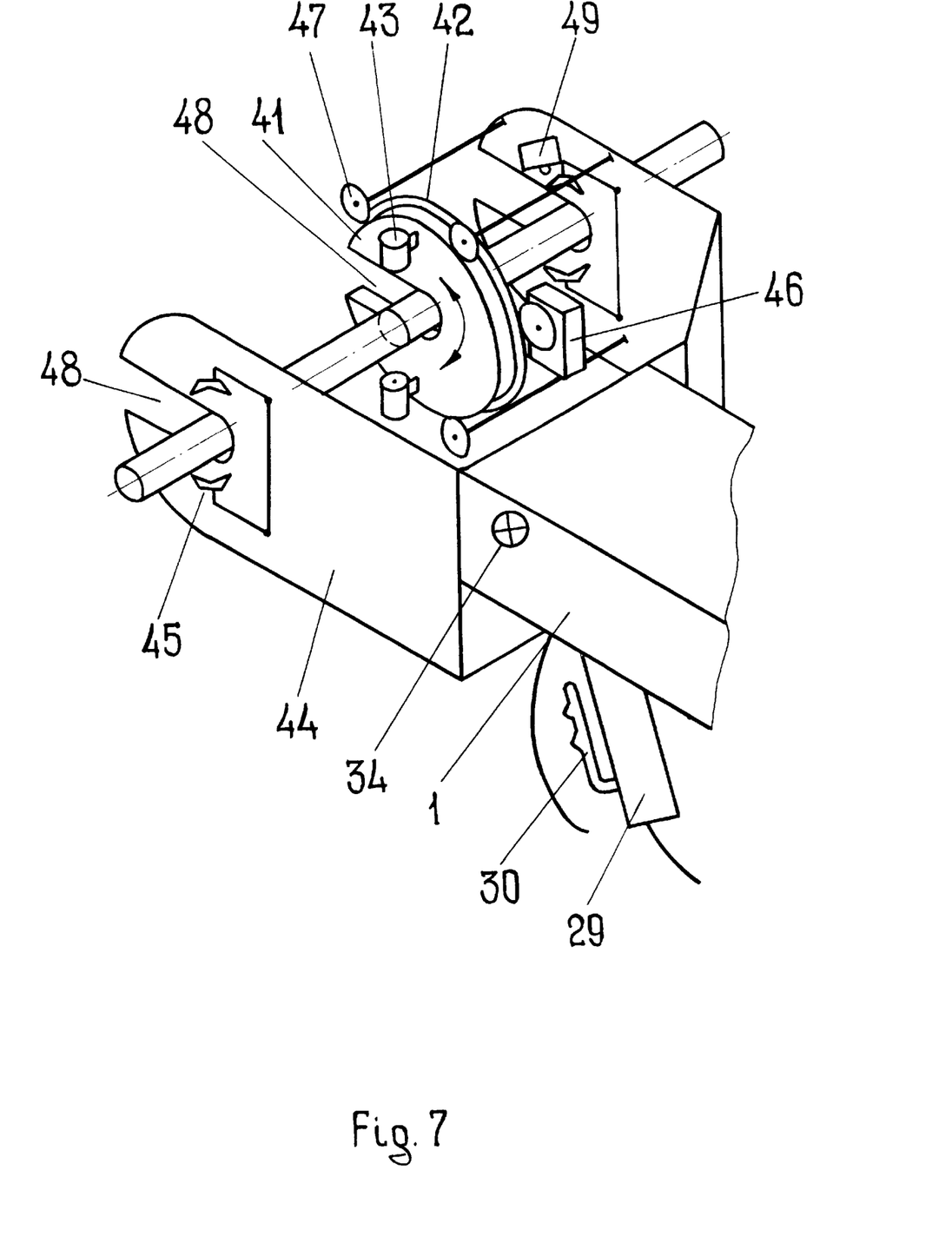
FIG. 7 shows the handtool equipped with the device for orbital welding and brazing of tubes, using two rotating electron beam guns.

The replaceable handtool 1 of FIG. 7 is designed for orbital welding and brazing of tubes. A rotatable wheel 41 has a gear ring 42 and two electron beam guns 43, shifted by 180 degrees relative to each other. A stationary part 44 includes a positioning and fixation mechanism 45, rotation drive 46 and support rollers 47, which come into engagement with the gear ring 42. Radial openings 48 are made in the gear ring 42 and positioning and fixation mechanism 45 for positioning the replaceable handtool 1 onto the tube and removing it from the tube. The dimensions of the openings 48 are larger than the tube diameter.

Limit switches 49 are located on the stationary part 44 and allow the electron beam guns 43 to be rotated through an angle not less than 180 degrees from each side of the initial position in which the radial openings 48 in the gear ring 42 and positioning and fixation mechanism 45 coincide. These openings 48 are made in such a manner that in each direction of rotation only one of the two electron beam guns 43, which corresponds to this direction of rotation, can be switched on. A neutral lead switch 32 is used for selection and indication of the electron beam gun 43 and of the corresponding rotational direction of the rotating part 41.

Figure 8:
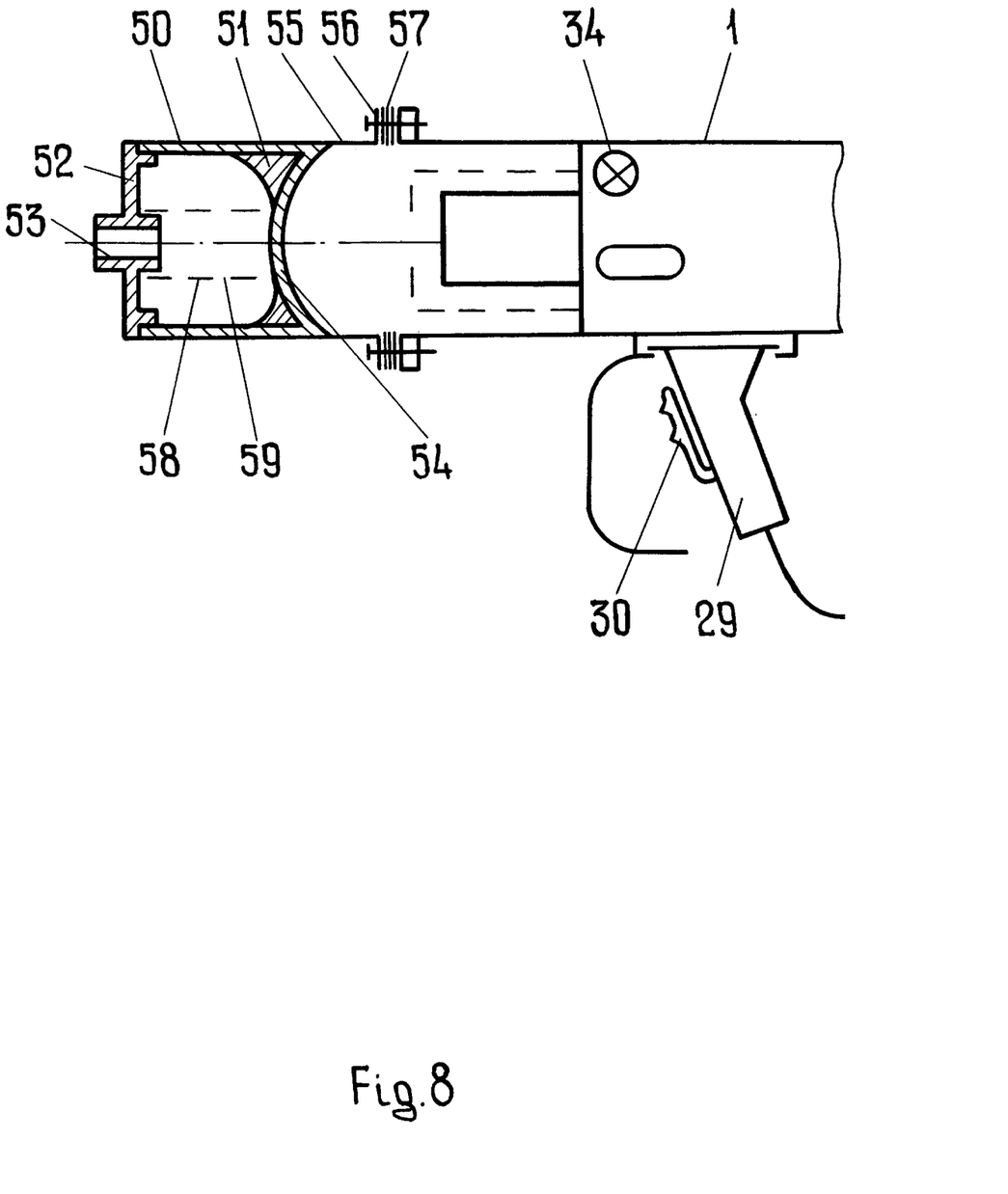
FIG. 8 is a schematic of the handtool for coating deposition by the method of thermal evaporation of materials under vacuum, using a crucible filled with the vaporizable material.

The replaceable handtool 1 of FIG. 8 is fitted for coating deposition by the method of thermal evaporation of materials under vacuum. At least one crucible 50 of a wettable material is located in front of the electron beam gun 27. The crucible 50 is filled with vaporizable material 51 and is covered by a sealed cover 52 having a channel 53 which forms and directs the vapor flow. The bottom 54 of the crucible 50 has a concave shape and is fitted with thin-walled sleeve 55 with a flange 56 connected to the replaceable handtool 1 via heat-insulating gaskets 57. The sleeve 55 encloses the bottom 54 around its perimeter from flow and functions as a heat sink.

A closed cylindrical high-melting partition 58 made of a wettable material is located inside the crucible 50 along its axis, and fastened at opposite ends to the bottom 54 and the cover 52 of the crucible 50. The partition 58 is made of a material with capillary properties and has perforations 59 for letting the vapor out.

Figure 9:
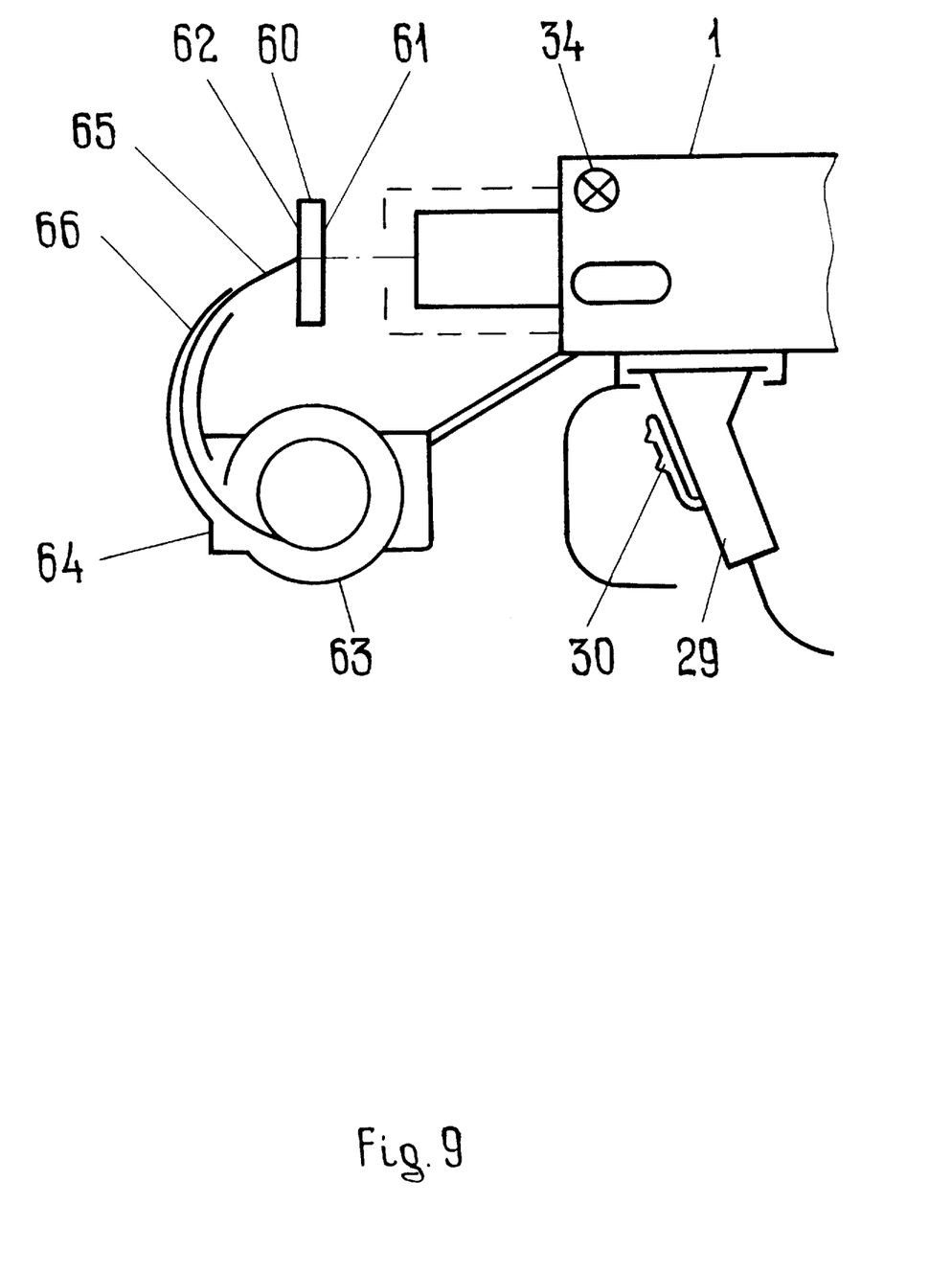
FIG. 9 is a schematic of the handtool for coating deposition by thermal evaporation of materials under vacuum, using a device for feeding vaporizable material from cassette.

The replaceable handtool 1 of FIG. 9 is designed for coating deposition by the method of thermal evaporation of materials under vacuum. A high-melting plate 60 is heated by the electron beam from the back side 61. A sprayable material 65 is fed from a replaceable cassette 63 of a feed mechanism 64 through a nozzle 66 to a face side 62 of the high-melting plate 60.

In operation, the container 2 housing the low-voltage hardware (see FIG. 2) is first installed on the outer shell of the space vehicle and fastened to it by means of the fastening devices 13 near the place where various mounting and repair work will be performed manually by an operator in a spacesuit. The replaceable handtool 1 has already been inserted into the seat 14 along the guiding slots 15 and fastened by latches 16. The monitoring module 3 (FIG. 3) is placed inside the space vehicle. The replaceable handtool 1, container 2 and monitoring module 3 are connected to each other by cables (5, 6), whereas the container with the low-voltage hardware 2 is further connected to the primary power source 4 through the electric connectors 7, which are specially designed to be used by the operator in a spacesuit, thus making up one circuit (see FIG. 1).

Before the operator goes outside the space vehicle in a spacesuit to perform technical work, the instruments 19 of the monitoring module 3 (see FIG. 3) which is inside the space vehicle, are used to check the parameters of the condition of the entire device for manual electron beam processing of materials in space and of the atmosphere in the container 2. The above parameters are indicated on the panel 22. The electric heater 11 is switched on if it is necessary to increase the temperature in the container 2. During the above check the trial switching on of the replaceable handtool 1 is performed, using the additional controls for its switching on 20 and switching off 21.

In order to prevent damage of the space vehicle by the electron beam during the performance of the above trial switching, the seat 14 is fitted (see FIG. 2) with a high-melting shield 17 mounted in front of the EB gun 27 in the position in which the replaceable handtool 1 is stored. Here, the logic elements 23 connected to the indicator 18 of the replaceable handtool 1, being in the seat 14 on the container 2, and to the control panel 12, permit switching on of the replaceable handtool 1, when the latter is in the seat 14, only through the monitoring module 3.

The operator performs the following operations (see FIGS. 2, 3, 4) outside the space vehicle in a spacesuit in the location where the mounting or repair work is carried out. The operator selects on the control panel 12 the required power mode of the electron beam gun 27 of the replaceable handtool 1; throws back the latches 16 from the rollers 36 and takes out the replaceable handtool 1, moving the keys 35 along the slots 15 of the seat 14; moves the switch 32 from the neutral position into the working position and points the replaceable handtool 1 onto the workpiece being treated; on the control panel 12 switches on the power to the container 2 from the primary power source 4, thereby switching on the inverter 9 and control system 10 which are enclosed in the sealed gas-filled casing 8.

By pressing the trigger 30 on the handle 29 of the replaceable handtool 1, the selected power mode of the electron beam gun 27 of the replaceable handtool 1 is switched on and the technical operations of welding, cutting, heating and/or brazing are performed as desired.

In order to guarantee a higher degree of safety for the operator when he is working outside the space vehicle in a spacesuit under conditions of limited visibility, limited mobility, unavailable support and microgravity, the electron beam gun 27 is covered by a protective mesh shield 28, preventing the operator's spacesuit from contacting those components of the gun which are heated. The replaceable handtool 1 incorporates the high-voltage power source 26 enclosed in the protective casing 25 and is connected to the container 2 by a low-voltage cable 33. The operator's hand is further protected by the guard 31 from exposure to the light and x-ray radiation which may be generated during operation of the device.

If required, the trigger 30 on the handle 29 of the replaceable handtool 1 is pressed further to switch on the next power mode of the electron beam gun 27 of the replaceable handtool 1, as compared to the mode selected on the control panel 12 and to simultaneously switch on the visual indicator 34.

Here, the logic elements 23 which connect the switching on controls 20 to the indicator 18 of the replaceable handtool 1, being in the seat 14 on the container 2, and to the control panel 12 permit switching on of the replaceable handtool 1, when the latter is not in the seat 14, only through the control panel 12. On the other hand, the OR logic element 24 enables the replaceable handtool 1 to be switched off, both from the control panel 12 on the container 2, and by the switching off controls 21 on the monitoring module 3.

Operation of the replaceable handtool 1 designed for welding with filler (see FIGS. 2, 3, 4 and 5) is as follows. Outside the space vehicle the operator in a spacesuit selects the required power mode of the EB gun 27 and the mode of operation of the filler feed mechanism 37 of the replaceable handtool 1 on the control panel 12; throws back the latches 16 from the rollers 36 and takes out the replaceable handtool 1, moving the keys 35 along the slots 15 of the seat 14; moves the switch 32 from the neutral position into the working position and points the replaceable handtool 1 onto the workpiece to be processed; on the control panel 12 switches on the power supply to the container 2 from the primary power source 4, thus switching on the inverter 9 and control system 10, which are enclosed in sealed, gas-filled casing 8.

The selected power mode of the electron beam gun 27 of the replaceable handtool 1 is switched on by pressing the trigger 30 on the handle 29 of the replaceable handtool 1. By completely depressing the trigger 30 on the handle 29 of the replaceable handtool 1, the operator switches on the filler feed 39 into the welding zone, and the visual indicator 34 simultaneously provides an indication of the operation of the filler feed mechanism 37 for the operator.

The replaceable handtool 1 for welding, cutting, brazing and heating of materials which incorporates the device for additional focusing of the electron beam 40 (see FIGS. 2, 3, 4, and 6) is used outside the space vehicle by an operator in a spacesuit as follows. On the control panel 12 the operator selects the required power mode of the EB gun 27 of the replaceable handtool 1; throws back the latches 16 from the rollers 36 and takes out the replaceable handtool 1 by moving the keys 35 over the slots 15 of the seat 14; moves the switch 32 from the neutral position into the working position and points the replaceable handtool 1 onto the workpiece to be processed; on the control panel 12 switches on the power supply to the container 2 from the primary power source 4, thus switching on the inverter 9 and the control system 10, which are enclosed in the sealed, gas-filled casing 8.

The selected power mode of the EB gun 27 of the replaceable handtool 1 is switched on by pressing the trigger 30 on the handle 29 of the replaceable handtool 1 and the operator performs the technical operations of welding, cutting, heating and/or brazing as desired.

When there is a need to increase the power density in the zone of electron beam processing, depending on the kind of material being processed and the thickness of the workpiece, the operator switches on the electron beam focusing device 40 by pressing the trigger 30 on the handle 29 of the replaceable handtool 1, and the visual indicator 34 is switched on simultaneously.

The replaceable handtool 1 designed for orbital welding and brazing of tubes (see FIGS. 2, 3, 4 and 7) should be used as follows. The operator selects the required power mode of the electron beam guns 43 of the replaceable handtool 1 on the panel of the device operation control 12; throws back the latches 16 from the rollers 36 and takes out the replaceable handtool 1, by moving the keys 35 along the slots 15 of the seat 14; moves the switch 32 from the neutral position into the working position; mounts the replaceable handtool 1 onto the tube, with the tube fitting into the radial openings 48 in the location where the process will be run; uses the positioning and fixation mechanism 45 to mount the wheel 41 concentrically with the tubing, simultaneously fastening it to the tubing, and also aligns the tubes to be welded; on the control panel 12 switches on the power supply to the container 2 from the primary power source 4, thus switching on the inverter 9 and control system 10 enclosed in the sealed, gas-filled casing 8.

When the trigger 30 on the handle 29 of the replaceable handtool 1 is pressed, the rotation drive 46 located on the stationary part 44 starts rotating the gear ring 42 in the support rollers 47, the gear ring 42 carrying the electron beam guns 43. Complete depression of the trigger 30 switches on the working voltage supply, in addition to the rotation, to one of the EB guns 43, which is indicated by the visual indicator 34. After half of the weld circumference has been welded, the limit switches 49 operate to stop the rotation drive 46.

Moving the switch 32 into the second working position assigns reversal of the direction rotation of the wheel 41 and the second pressing of the trigger 30 on the handle 29 of the replaceable handtool 1 switches on the reversal of the rotation drive 46, whereas complete depression of the trigger switches on the second EB gun 43, which is indicated by the visual indicator 34. After the second half of the weld circumference has been welded, the limit switches 49 operate to stop the rotation drive 46.

Coating deposition by the method of thermal evaporation of materials under vacuum using the replaceable handtool 1 designed for these purposes (see FIGS. 2, 3, 4 and 8) is performed as follows. On the control panel 12 the operator selects the required power mode of the EB gun 27 of the replaceable handtool 1; throws back the latches 16 from the rollers 36 and takes out the replaceable handtool 1, moving the keys 35 along the slots 15 of the seat 14; moves the switch 32 from the neutral position into the working position and points the replaceable handtool 1 to the workpiece which is to be coated; on the control panel 12 switches on the power supply to the container 2 from the primary power source 4, thus switching on the inverter 9 and control system 10 which are enclosed in the sealed, gas-filled casing 8.

When the trigger 30 on the handle 29 of the replaceable handtool 1 is pressed, the selected power mode of the EB gun 27 of the replaceable handtool 1 is switched on and the bottom 54 of the crucible 50 is heated. Under zero gravity conditions the melt of the vaporizable material, under the action of the surface tension forces, takes such a position in the crucible 50 that the layer thickness is maximum in the zone of the metered heat sinking into the thin-walled sleeve 55 with the flange 56 which, through the heat-insulating gaskets 57, is connected to the replaceable handtool 1. The layer thickness is minimum in the zone of heating by the electron beam. The melt feeding into the heating zone is made possible by the capillary properties of the wettable material which has holes 59. The channel 53 in the sealed cover 52 forms and directs the evaporation material flow 51.

If it is necessary to increase the productivity of coating deposition, the trigger 30 on the handle 29 of the replaceable handtool 1 is completely depressed to switch on the next power mode of the EB gun 27 of the replaceable handtool 1, as compared to the mode selected on the control panel 12, which increases the crucible 50 temperature and the evaporation rate. The visual indicator 34 is switched on at the same time.

The refractory partition 58 also prevents the melt from splashing out of the crucible 50 during abrupt movements of the replaceable handtool 1.

The replaceable handtool 1 designed for coating deposition by the method of thermal evaporation of materials under vacuum (see FIGS. 2, 3, 4, and 9) is used by the operator as follows. Outside the space vehicle the operator in a spacesuit selects on the control panel 12 the required power mode of the EB gun 27 and the mode of the feed mechanism operation 64 of the replaceable handtool 1; throws back the latches 16 from the rollers 36 and takes out the replaceable handtool 1 by moving the keys 35 through the slots 15 of the seat 14; moves the switch 32 from the neutral into the working position and points the replaceable handtool 1 to the workpiece to be processed; on the control panel 12 switches on the power supply to the container 2 from the primary power source 4, thus switching on the inverter 9 and the control system 10 which are enclosed in the sealed gas-filled casing 8.

When the trigger 30 on the handle 29 is pressed, the selected power mode of the EB gun 27 of the replaceable handtool 1 is switched on, and heating of the high-melting plate 60 from the back side 61 is performed up to the temperature which greatly exceeds the melting temperature of the sprayable material 65. When the trigger 30 on the handle 29 of the replaceable handtool 1 is completely depressed the sprayable material 65 is fed from the replaceable cassette 63 through the nozzle 66 of the feed mechanism 64 onto the face side 62 of the high-melting plate 60 and, simultaneously, the visual indicator 34 provides indication to the operator about the function of the feed mechanism 64.

When the sprayable material 65 comes into contact with the overheated face side 62 of the high-melting plate 60, it is vaporized in the direction normal to the above surface.

While the invention has been described in terms of its preferred embodiments, those skilled in the art will recognize that the invention can be practiced with considerable variation within the scope and spirit of the appended claims.

We claim:

1. A device for manual electron beam processing of materials in space, including:

a replaceable handtool;

a container placed outside a space vehicle for enclosing low-voltage hardware comprising an inverter, control system and electric heater in a sealed, gas filled casing;

a monitoring module located inside the space vehicle for controlling the inverter control system and electric heater;

a control panel mounted on an outer surface of the sealed, gas-filled casing;

devices for fastening the container to a surface of the space vehicle;

a seat for placement and fixation of the replaceable handtool fitted with slots, latches and a metalic high-melting shield installed in front of an EB gun in the handtool when the handtool is stored in the seat;

an indicator of the handtool being in the seat;

wherein the handtool, container and monitoring module are connected to each other and to a primary power source by cables with electrical connectors designed to be used by an operator in a spacesuit.

2. The device as claimed in claim 1, wherein:

the monitoring module contains instruments for monitoring parameters of the condition of the low-voltage hardware and atmosphere in the container with the low-voltage hardware, additional controls for switching on and off the replaceable handtool, and a panel on which said parameters are displayed;

controls for switching on the replaceable handtool are connected to the indicator of the handtool being in the seat on the container and control panel through logic elements which allow the handtool to be switched on, when the handtool is in the seat only through the monitoring module, and when the handtool is not in the seat through the control panel; and controls for the replaceable handtool switching off on the monitoring module and on the control panel are connected through an OR logic element.

3. The device claimed in claim 1, wherein the replaceable handtool comprises:

a protective casing which accommodates a high-voltage power source, and at least one short-focus EB gun, fastened to a front part of the protective casing;

a handle connected to a lower part of the protective casing, capable of rotation around its axis and of fixation in extreme and intermediate positions selected in such a way that the EB gun could not be pointed at the operator;

a non-fixing, at least two-position trigger, located on the handle and electrically connected through an AND circuit to a button for switching power off on the control panel;

a visual indicator which is electrically connected to the trigger and indicates switching to another power level, as compared to a mode previously selected on the control panel;

a protective guard which protects the operator's hand from exposure to light and x-ray radiation generated during operation of the device;

a mesh shield which prevents contact between the EB gun and an operator's spacesuit;

keys and rollers which fit the slots and latches of the seat for placement and fixation of the replaceable handtool.

4. The device as claimed in claim 3, comprising a neutral lead switch located in a rear part of the protective casing of the replaceable handtool for selection and indication of the EB gun.

5. The device as claimed in claim 3, wherein the replaceable handtool comprises an electron beam focusing device capable of.

6. The device as claimed in claim 3, wherein the replaceable handtool is designed for welding and brazing with filler and comprises:

a filler feed mechanism capable of setting-up rotation around an axis of an electron beam emitted from the EB gun;

a replaceable cassette with filler;

a visual indicator electrically connected to the trigger which indicates switching on of the filler feed mechanism in addition to the electron beam when said bean is already switched on.

7. The device as claimed in claim 3, wherein the replaceable handtool is designed for orbital welding and brazing of tubes, and comprises:

a rotating part which interacts with support rollers and a rotation drive, and which is fitted with a gear ring and two diametrically opposed EB guns;

a stationary part comprising a mechanism for positioning and fixation on a tube;

radial openings for mounting and removing the handtool on and from the tube which are made in the gear ring and in the mechanism for positioning and fixation on the tube wherein a width of the radial openings exceeds a diameter of the tube; and limit switches located on the rotating part which allow the EB guns to be turned through an angle of not less than 180 degrees to each side of an initial position, at which angle the openings in the gear ring and in the mechanism of positioning and fixation on the tube coincide, the openings being cut out in such a way that in each direction of rotation only one electron beam gun can be switched on.

8. The device as claimed in claim 3, wherein the replaceable handtool is fitted for coating deposition by a method of thermal evaporation under vacuum and comprises:

at least one crucible of a wettable material filled with a vaporizable material and located in front of the EB gun;

a bottom of the crucible made to have a concave shape and fitted with a heat-sink comprising a thin-walled sleeve with a flange which is connected to the replaceable handtool by insulating gaskets;

a closed, high-melting partition of a wettable material with capillary properties, having holes for letting out vapor, made of a mesh, located inside the crucible along its axis and fastened at opposite ends to the bottom and cover of the crucible, with a channel for directing and forming the vapor flow;

wherein diameter and length of the channel are given by the following ratios:

$0.6\ L < d < L$ and $0.5\ h < L < 0.7\ h$;

where L is the channel length, d is the channel diameter, and h is the distance from an outer edge of the channel to a protrusion on the crucible bottom.

9. The device as claimed in claim 3, wherein the replaceable handtool is equipped for coating deposition by a method of thermal evaporation under vacuum and comprises:

a high-melting plate, fixed in front of an electron beam emitted by the EB gun;

a nozzle of a mechanism for feeding a sprayable material directed at the high-meting plate from a side opposite from a side of incidence of the electron beam;

a replaceable cassette containing the sprayable material; and a visual indicator electrically connected to the trigger for indicating switching on of the feeding mechanism, in addition to the already switched on electron beam.

* * * * *